United States Patent [19]
Kuge et al.

[11] Patent Number: 6,157,052
[45] Date of Patent: *Dec. 5, 2000

[54] SEMICONDUCTOR INTEGRATED CIRCUIT HAVING THREE WIRING LAYERS

[75] Inventors: Shigehiro Kuge; Kazutami Arimoto, both of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/174,315

[22] Filed: Oct. 19, 1998

Related U.S. Application Data

[63] Continuation of application No. 08/789,241, Jan. 28, 1997, Pat. No. 5,847,420, which is a continuation of application No. 08/393,643, Feb. 24, 1995, abandoned.

[30] Foreign Application Priority Data

Mar. 3, 1994 [JP] Japan .................................. 6-033345

[51] Int. Cl.$^7$ .................................................. H01L 27/10
[52] U.S. Cl. ......................... 257/207; 257/204; 257/208; 257/211
[58] Field of Search ................................. 257/204, 207, 257/208, 211

[56] References Cited

U.S. PATENT DOCUMENTS

| | | | |
|---|---|---|---|
| 4,884,118 | 11/1989 | Hui et al. ................................ | 257/208 |
| 5,322,712 | 6/1994 | Norman et al. ......................... | 427/250 |
| 5,397,742 | 3/1995 | Kim ........................................ | 438/630 |
| 5,401,989 | 3/1995 | Kikuchi .................................. | 257/211 |
| 5,438,537 | 8/1995 | Sasaki .................................... | 257/359 |
| 5,561,623 | 10/1996 | Ema ....................................... | 257/390 |
| 5,686,746 | 11/1997 | Iwasa .................................... | 257/296 |

FOREIGN PATENT DOCUMENTS

| | | |
|---|---|---|
| 2-54576 | 2/1990 | Japan . |
| 2-248049 | 10/1990 | Japan . |
| 3-108760 | 5/1991 | Japan . |
| 4-132255 | 5/1992 | Japan . |
| 5-144943 | 6/1993 | Japan . |

OTHER PUBLICATIONS

Arimoto et al., "A 34ns 16Mb DRAM with controllable voltage down convertor", ESSCIRC Proceeding, Sep. 1991, pp. 21–24.

Horiguchi et al., "Switched–Source Impedance CMOS Circuit for Low Standby Subthreshold Current GIGA–Scale LSI'S" 1993 Symposium on VLSI Circuit, Dig. of Tech. Papers, pp. 47–48.

*Primary Examiner*—Mahshid Saadat
*Assistant Examiner*—Jhihan B Clark
*Attorney, Agent, or Firm*—McDermott, Will & Emery

[57] ABSTRACT

A high melting point metal wiring layer, a second aluminum wiring layer, and a third aluminum wiring layer are stacked on transistors forming an inverter train of a hierarchical power supply structure respectively. The high melting point metal wiring layer is employed as a local wire for connecting the transistors with each other, the second aluminum wiring layer is employed as a local bus wire and a hierarchical power supply wire, and the third aluminum wiring layer is employed as a main bus wire and a power supply wire to intersect with the respective wires. Consequently, the wiring layers are easy to lay out, while no main bus region is required dissimilarly to the prior art and it is possible to reduce the layout area.

22 Claims, 15 Drawing Sheets

SEMICONDUCTOR INTEGRATED CIRCUIT HAVING THREE WIRING LAYERS

This application is a continuation of application Ser. No. 08/789,241 filed Jan. 28, 1997, now U.S. Pat. No. 5,847,420 which is a continuation of application Ser. No. 08/393,643 filed Feb. 24, 1995, abandoned.

BACKGROUND OF THE INVENTION

1. Field of the Invention

The present invention relates to a semiconductor integrated circuit, and more particularly, it relates to a semiconductor integrated circuit comprising first, second and third wiring layers which are successively stacked on a semiconductor device group including a plurality of semiconductor devices having prescribed functions respectively.

2. Description of the Background Art

In relation to a general megabit-class semiconductor memory device, particularly a DRAM (dynamic random access memory), the mainstream is formed by a memory cell array architecture employing two layers of aluminum wires, as described in ESSCIRC Proceeding, September 1991, pp. 21 to 24.

A conventional semiconductor integrated circuit employing such two layers of aluminum wiring patterns is now described with reference to the drawings. FIG. 13 illustrates the structure on a chip of the conventional semiconductor integrated circuit.

Referring to FIG. 13, the semiconductor integrated circuit includes four memory cell array regions 31 which are arranged in two rows and two columns, and a peripheral circuit region 32 which is provided between the four memory cell array regions 31. Each memory cell array region 31 includes a plurality of subarrays 33 which are arranged in the row direction, a plurality of sense amplifier blocks 34 which are provided between and on both ends of the subarrays 33, a row decoder 35 which is arranged adjacently to the plurality of subarrays 33 and the plurality of sense amplifier blocks 34, and a column decoder 36 which is arranged adjacently to the innermost sense amplifier block 34.

Concrete structures of the subarrays 33 and the sense amplifier blocks 34 shown in FIG. 13 are now described. FIG. 14 illustrates the concrete structures of each subarray 33 and the sense amplifier blocks 34 shown in FIG. 13.

Referring to FIG. 14, each subarray 33 includes a plurality of memory cells MC, a plurality of bit lines BL and /BL ("/" stands for complementary signal wires), and a plurality of word lines WL. The subarray 33 has a folded bit line structure.

The memory cells MC are connected with corresponding ones of the bit lines BL and /BL and the word lines WL respectively. The bit lines BL and /BL are connected with sense amplifiers 34a.

In the conventional DRAM, a plurality of semiconductor devices such as transistors and capacitors are formed on a silicon substrate, and a first high melting point metal wiring layer W, a second aluminum wiring layer Al1 and a third aluminum wiring layer Al2 are successively stacked thereon.

In the region shown in FIG. 14, the first high melting point metal wiring layer W is employed as the bit lines BL and /BL. The second aluminum wiring layer Al1 is employed as parts of the word lines WL. In more concrete terms, this layer Al1 is employed as shunts (pile drivers) for reducing the time constants of the word lines WL. The third aluminum wiring layer Al2 is employed as column selection lines CSL for transmitting an output signal of each column decoder 36 shown in FIG. 13.

The bit lines BL and /BL are formed by the high melting point metal wiring layer W as hereinabove described, for the following reason:

It is necessary to reduce power consumption by reducing the capacitances of the bit lines BL and /BL themselves, to ensure operating margins by increasing signal amplitudes read from the memory cells MC, and to reduce noises between the bit lines BL and /BL by reducing the capacitances across the same. Thus, it is necessary to reduce the thicknesses of the bit lines BL and /BL, which in turn tend to be increased in resistance. However, it is necessary to reduce the bit lines BL and /BL in resistance, in order to increase the speed of the DRAM. Therefore, the high melting point metal wiring layer W having a low resistance value is employed for the bit lines BL and /BL, in order to reduce the resistances thereof in addition to reduction in thickness. The high melting point metal wiring layer W is also adapted to prevent the material forming the bit lines BL and /BL from migration into the silicon substrate. While the high melting point metal has generally been prepared from tungsten silicide (WSi), a material having a lower resistance such as tungsten (W) or titanium silicide (TiSi) is recently employed for the purpose of reduction in resistance.

The structure in an area X of the peripheral circuit region 32 shown in FIG. 13 is now described in detail. FIG. 15 is an enlarged view showing respective regions on the semiconductor substrate in the area X shown in FIG. 13.

Referring to FIG. 15, the area X of the peripheral circuit region 32 includes bus regions BR, NMOS regions NR and PMOS regions PR. The bus, NMOS and PMOS regions BR, NR and PR are alternately set along the longer edges of the area X respectively.

The bus regions BR are provided thereon with bus wires for transmitting signals from peripheral circuits by the third aluminum wiring layer Al2, with no semiconductor devices such as NMOS and PMOS transistors. On the other hand, the NMOS regions NR are provided with NMOS transistors, and the PMOS regions BR are provided with PMOS transistors and the like. The NMOS and PMOS regions NR and PR are hereinafter defined as circuit regions CR.

The structure of the third aluminum wiring layer Al2 in the area X is now described in detail. FIG. 16 is an enlarged view showing the structure of the third aluminum wiring layer Al2 in the area X shown in FIG. 13.

Referring to FIG. 16, a plurality of bus signal wires BSL are arranged in each bus region BR. Two power supply wires $V_{CC}$ and $V_{SS}$ are arranged in each circuit region CR. The respective wires are thereafter similarly repeated on the respective regions. The bus signal wires BSL and the power supply wires $V_{CC}$ and $V_{SS}$ are formed by the third aluminum wiring layer Al2.

The semiconductor devices which are formed on each circuit region CR are supplied with power supply voltages $V_{CC}$ and $V_{SS}$ by the set of power supply wires $V_{CC}$ and $V_{SS}$. In more concrete terms, the third aluminum wiring layer Al2 is connected with the second aluminum wiring layer Al1 via through holes, while the second aluminum wiring layer Al1 is connected with prescribed semiconductor devices which are formed on the circuit regions CR through contact holes. Namely, the second aluminum wiring layer Al1 is employed as local wires for connection with the semiconductor devices which are formed on the circuit regions CR. Also on the bus regions BR, the second aluminum wiring layer Al1 is employed as local wires, for connecting the bus signal wires BSL which are formed by the third aluminum wiring layer Al2 with prescribed semiconductor elements formed on the circuit regions CR.

In the conventional DRAM, as hereinabove described, the first high melting point metal wiring layer W, which is employed as the bit lines BL and /BL in the memory cell array regions 31, is hardly used in the peripheral circuit region 32. This is because the sheet resistance of the conventional high melting point metal wiring layer W which is made of tungsten silicide (WSi) is so high that the signal delay is too large for application to local wires for connecting the semiconductor devices provided on the circuit regions CR with each other.

Therefore, it is necessary to use the second aluminum wiring layer, portions of the third aluminum wiring layer provided on the circuit regions and the remaining portions thereof as the local wires, the power supply wires and the bus signal wires respectively as hereinabove described, and hence it is necessary to provide the bus regions which are provided with no semiconductor devices on the semiconductor substrate, in addition to the circuit regions. Consequently, high integration of the semiconductor integrated circuit cannot be attained.

In recent years, however, it is possible to employ a high melting point metal wiring layer having a small sheet resistance, which is prepared from a high melting point metal material such as tungsten (W) or titanium silicide (TiSi). When a high melting point metal wiring layer which is made of such a material is employed for the wires provided in the peripheral circuit region, it is possible to prevent the aforementioned problem of the signal delay. Therefore, it is possible to create a new layout utilizing a high melting point metal wiring layer, which has been employed only as the bit lines BL and /BL in general.

SUMMARY OF THE INVENTION

An object of the present invention is to provide a semiconductor integrated circuit which is easy to lay out and suitable for high integration.

Another object of the present invention is to provide a semiconductor integrated circuit in which a hierarchical power supply consisting of a plurality of power supply wires is easy to lay out.

Still another object of the present invention is to provide a semiconductor integrated circuit which can reduce wiring capacitances of main buses for peripheral circuits and increase the speed of signal transmission through the main buses.

A further object of the present is to provide a semiconductor integrated circuit which can reduce crosstalks in signal wires for peripheral circuits, thereby reducing noises of the signal wires.

A further object of the present invention is to provide a semiconductor integrated circuit which can prevent circuits provided therein from being latched up.

A semiconductor integrated circuit according to an aspect of the present invention includes a semiconductor device group, which is formed on a semiconductor substrate, including a plurality of semiconductor devices having prescribed functions respectively, a first wiring layer, which is stacked on the semiconductor device group, including local wires for connecting the semiconductor devices with each other, a second wiring layer which is stacked on the first wiring layer to extend in a first direction, and a third wiring layer which is stacked on the second wiring layer to extend in a second direction intersecting with the first direction.

Due to the aforementioned structure, the first wiring layer is employed as the local wires for connecting the semiconductor devices with each other. Further, the second and third wiring layers extend in the directions intersecting with each other, whereby an arbitrary wire of the second wiring layer necessarily intersects with that of the third wiring layer in a single portion. Therefore, it is possible to connect arbitrary wires of the second and third wiring layers with each other by connecting such intersections. Further, it is possible to connect the second wiring layer with arbitrary semiconductor devices through the first wiring layer serving as the local wires. Consequently, it is possible to arbitrarily lay out wires such as power supply wires and signal wires on the first and second wiring layers for simplifying the layout, while it is possible to highly integrate the semiconductor integrated circuit with no requirement for forming bus regions provided with no semiconductor devices on the semiconductor substrate.

Preferably, the second direction for the extension of the third wiring layer is along the longitudinal direction of the semiconductor device group and the third wiring layer includes main bus wires for the semiconductor device group, while the second wiring layer includes local bus wires for the semiconductor device group.

Due to the aforementioned structure, the main bus wires are formed along the longitudinal direction of the semiconductor device group, while the local bus wires are formed along the direction for intersecting with the main bus wires. Further, the second wiring layer is arranged between the first and second wiring layers, whereby the wiring capacitance of the second wiring layer is increased and that of the third wiring layer is reduced. Therefore, it is possible to transmit signals at a high speed through the main bus wires having small wiring capacitances.

Preferably, the second wiring layer includes hierarchical power supply wires for supplying hierarchical power supply voltages to the semiconductor device group. Therefore, the second wiring layer can be employed as the hierarchical wires for supplying hierarchical power supply voltages to the semiconductor device group, whereby the hierarchical power supply wires are easy to lay out.

Preferably, the second wiring layer includes the power supply wires for supplying power supply voltages to the semiconductor device group and the third wiring layer includes signal wires for inputting/outputting prescribed signals in/from the semiconductor device group, while the power supply wires are arranged to cover the signal wires. Thus, the second wiring layer serving as the power supply wires is arranged to cover the third wiring layer serving as the signal wires, whereby the second wiring layer effectively serves as a shielding layer. Consequently, crosstalks between the first and third wiring layers are reduced, and it is possible to reduce noises of the signal wires formed by the third wiring layer.

Preferably, the semiconductor integrated circuit has connecting portions which are formed by partially hollowing the second wiring layer serving as the power supply wires, for connecting at least one of the first wiring layer and the semiconductor device group with the third wiring layer. Consequently, it is possible to readily connect the first wiring layer or the semiconductor device group with the third wiring layer also when the power supply wires are increased in width, whereby the layout is simplified.

Preferably, the semiconductor device group includes semiconductor devices of a first conductivity group and those of a second conductivity group which is different from the first conductivity group, while the semiconductor substrate includes a first region provided with the first conductivity type semiconductor devices, a second region, which is arranged adjacently to the first region, provided with the second conductivity type semiconductor devices, a third region, which is arranged adjacently to the second region, provided with the second conductivity type semiconductor devices, and a fourth region, which is arranged adjacently to the third region, provided with the first conductivity type semiconductor devices.

Due to the aforementioned structure, the second and third regions which are provided with the second conductivity type semiconductor devices are arranged between the first and second regions which are provided with the first conductivity type semiconductor devices, whereby the space between the first and fourth regions is widened and it is possible to prevent circuits provided on the respective regions from being latched up.

Preferably, the second wiring layer supplies a set of hierarchical power supply voltages to the first or fourth region. Therefore, the number of the power supply wires is reduced and the second wiring layer is easy to lay out.

Preferably, the semiconductor device group includes semiconductor devices of a first conductivity type and those of a second conductivity type which is different from the first conductivity type, and the semiconductor substrate includes a plurality of circuit regions including a first region provided with the first conductivity type semiconductor devices and a second region, which is arranged adjacently to the first region, provided with the second conductivity type semiconductor devices, while one of the plurality of circuit regions includes a switching device forming region forming a switching device for generating a set of hierarchical power supply voltages, and the third wiring layer includes a hierarchical power supply wire for supplying the set of hierarchical power supply voltages generated from the one of the circuit regions to the remaining circuit regions.

Due to the aforementioned structure, one of the plurality of circuit regions is provided with the switching device region forming the switching device for generating the set of hierarchical power supply voltages so that the set of hierarchical power supply voltages as generated are supplied to the remaining circuit regions, whereby the area of the switching device region can be reduced and high integration of the semiconductor integrated circuit can be attained.

A semiconductor integrated device according to another aspect of the present invention includes a memory cell array including a plurality of memory cells which are arranged in row and column directions respectively, a peripheral semiconductor device group including a plurality of semiconductor devices, which are arranged around the memory cell array, having prescribed functions respectively, a first wiring layer, which is stacked on the memory cell array and the peripheral semiconductor device group, including bit lines connected with the memory cells and local wires connected with the semiconductor devices respectively, a second wiring layer, which is stacked on the first wiring layer, including main bus wires extending in a first direction, and a third wiring layer, which is stacked on the second wiring layer, including local bus wires extending in a second direction intersecting with the first direction.

Due to the aforementioned structure, the first wiring layer can be employed as the bit lines connected to the memory cells and the local wires connecting the semiconductor devices with each other. Further, the second and third wiring layers extend to intersect with each other, whereby an arbitrary wire of the second wiring layer necessarily intersects with that of the third wiring layer in a single portion. Therefore, it is possible to connect arbitrary wires of the second and third wiring layers with each other by connecting such intersections, while it is possible to connect the peripheral semiconductor device group with the local bus wires and the main bus wires by connecting the first and second wiring layers with each other. Consequently, it is possible to readily connect an arbitrary wire of the third wiring layer with the peripheral semiconductor device group for simplifying the layout, while it is possible to highly integrate the semiconductor integrated circuit with no requirement for forming bus regions provided with no semiconductor devices in the region provided with the peripheral semiconductor device group.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
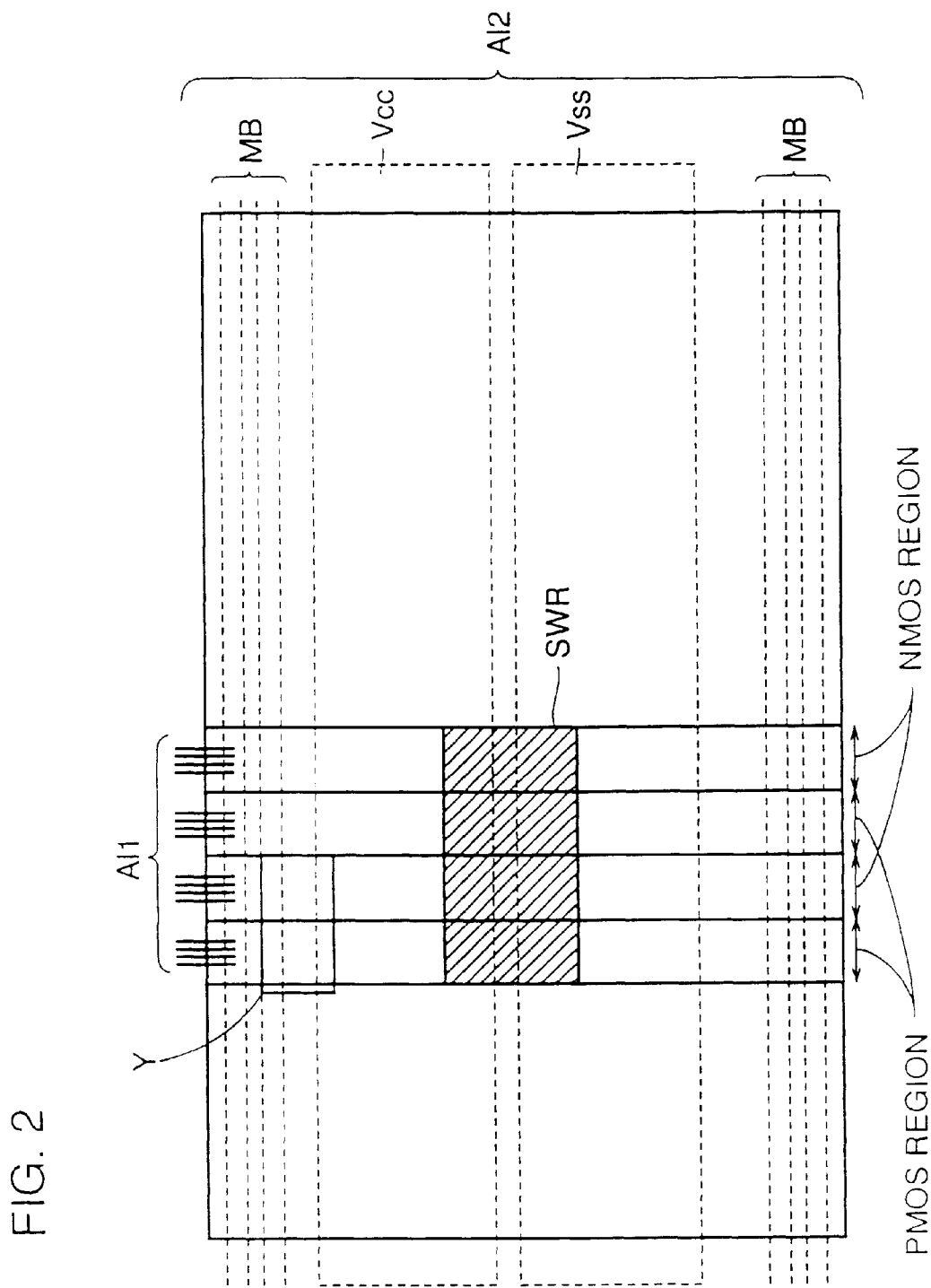
FIG. 2 illustrates second and third aluminum wiring layers in an area X of a peripheral circuit region and respective regions on a semiconductor substrate in a semiconductor integrated circuit according to a first embodiment of the present invention.
Figure 13:
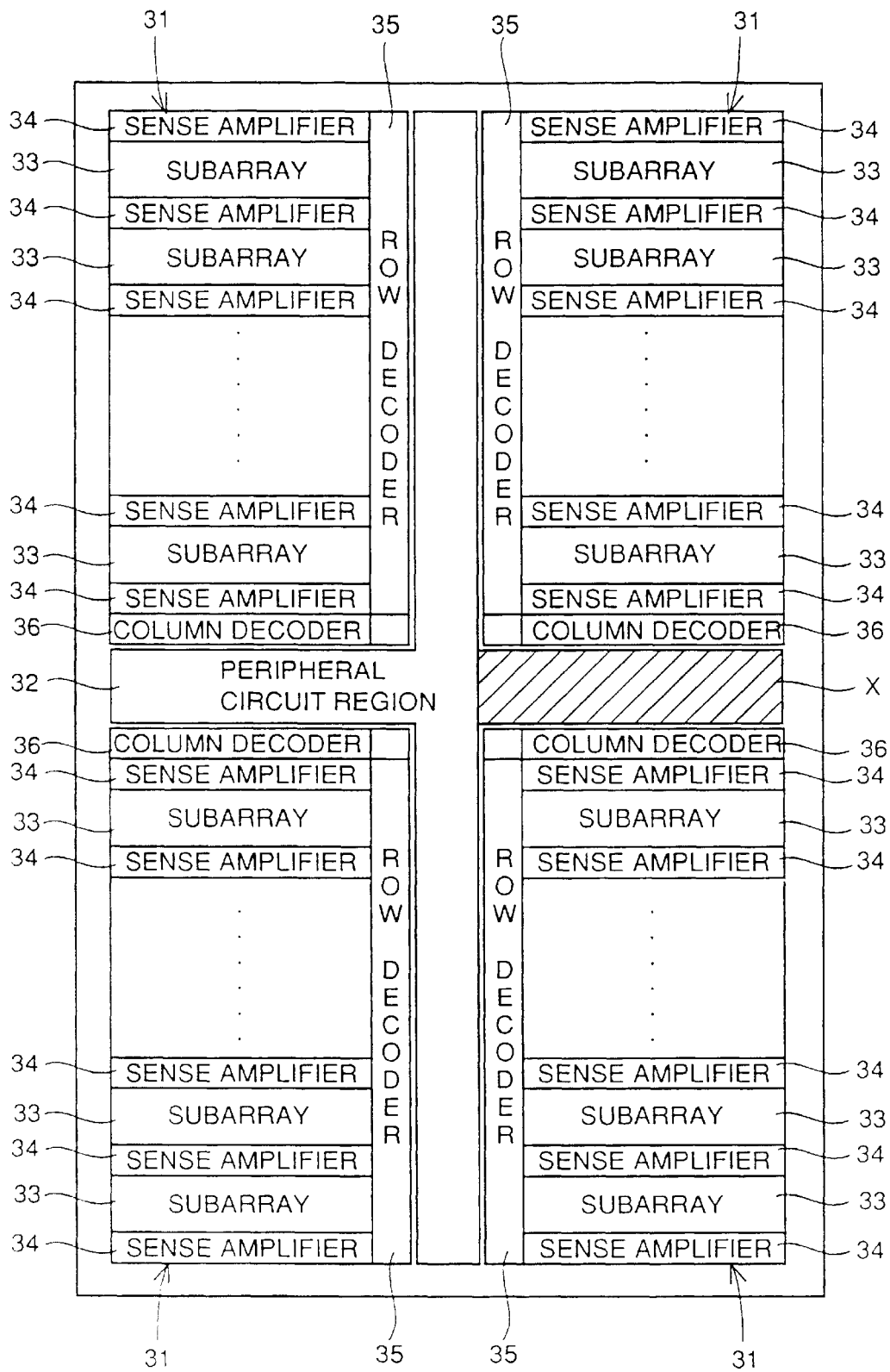
FIG. 13 illustrates the structure on a chip of a conventional semiconductor integrated circuit.
Figure 14:
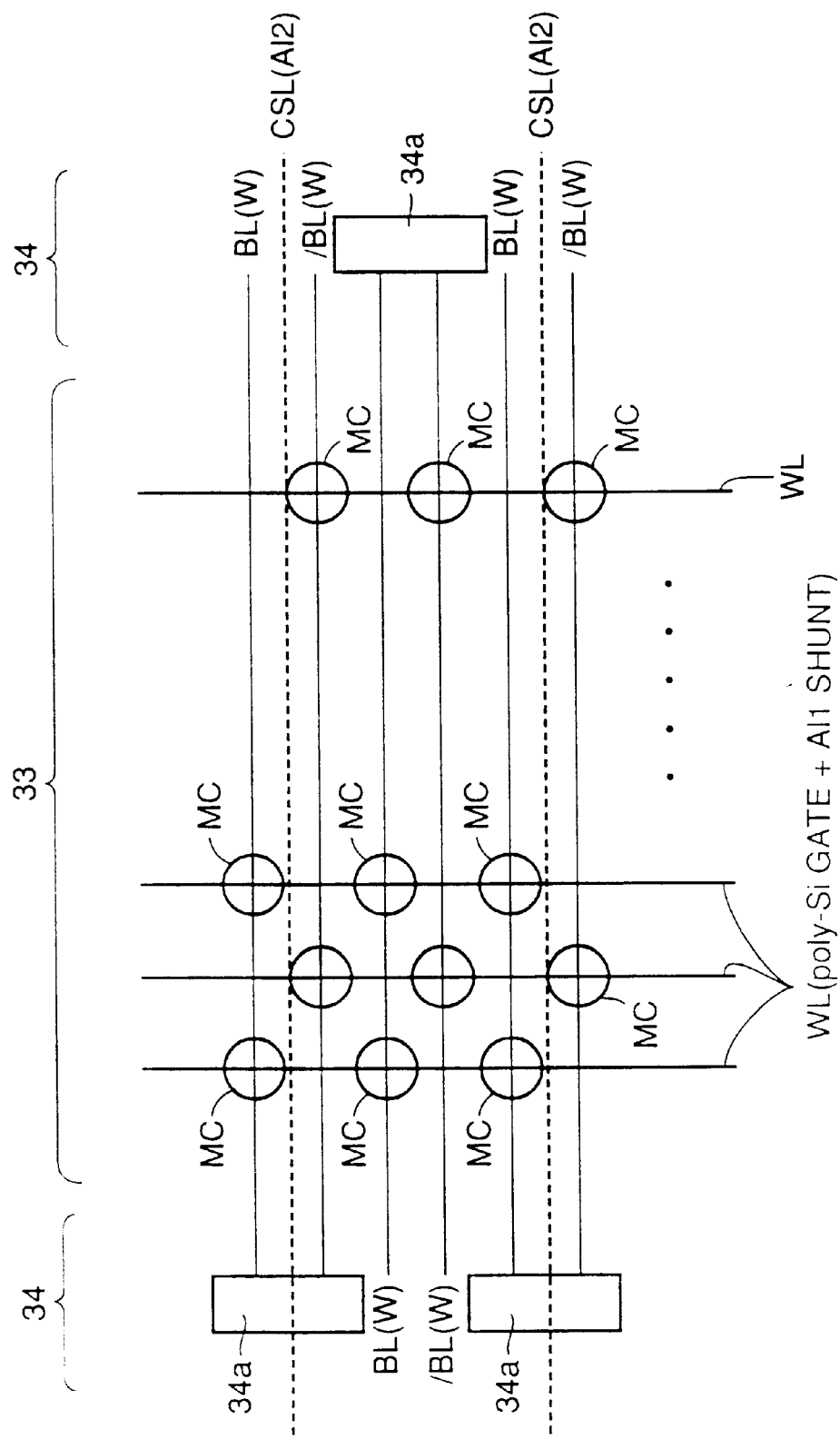
FIG. 14 illustrates concrete structures of a subarray and sense amplifier blocks shown in FIG. 13.

With reference to the drawings, description is now made on a DRAM which is a semiconductor integrated circuit according to a first embodiment of the present invention. The DRAM according to the first embodiment of the present invention is similar in structure to the conventional DRAM shown in FIG. 13 except a peripheral circuit region 32, and hence redundant description is omitted except an area X of the peripheral circuit region 32. Each embodiment of the present invention is described in detail with reference to this area X. FIG. 2 illustrates second and third aluminum wiring layers in the area X of the peripheral circuit region 32 and respective regions on a semiconductor substrate in the semiconductor integrated circuit according to the first embodiment of the present invention.

Figure 11:
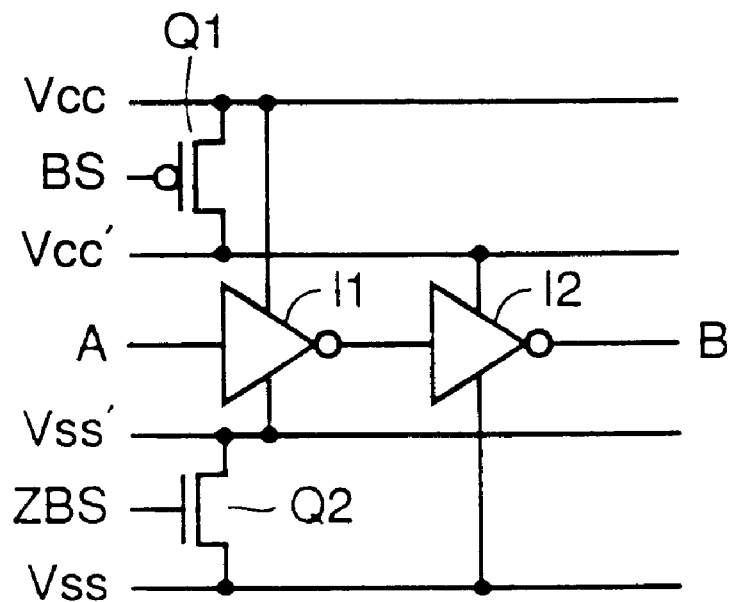
FIG. 11 is a circuit diagram showing the structure of an inverter train of a hierarchical power supply structure.

The semiconductor integrated circuit shown in FIG. 2 employs a hierarchical power supply structure, which is disclosed in 1993 Symposium on VLSI Circuit, Dig. of Tech. Papers, pp. 47–48, for example. This hierarchical power supply structure is adapted to suppress increase of subthreshold currents following reduction of threshold values of MOS transistors caused by future high integration, for enabling a high-speed operation of the circuit under a low voltage. FIG. 11 illustrates an exemplary structure of an inverter train employing the hierarchical power supply structure. Referring to FIG. 11, an inverter I1 is connected with hierarchical power supply voltages $V_{CC}$ and $V_{SS}'$, and an inverter I2 is connected with hierarchical power supply voltages $V_{CC}'$ and $V_{SS}$, for example. A switching transistor Q1 is connected across the hierarchical power supply voltages $V_{CC}$ and $V_{CC}'$, while a switching transistor Q2 is connected across the hierarchical power supply voltages $V_{SS}$ and $V_{SS}'$. Due to this structure, internal power supply voltages of the hierarchical power supply voltages $V_{CC}'$ and $V_{SS}'$ which are outputted through the switching transistors Q1 and Q2 are generated in addition to the power supply voltages of the hierarchical power supply voltages $V_{CC}$ and $V_{SS}$ in the hierarchical power supply structure, thereby forming a circuit through these power supply voltages.

Figure 15:
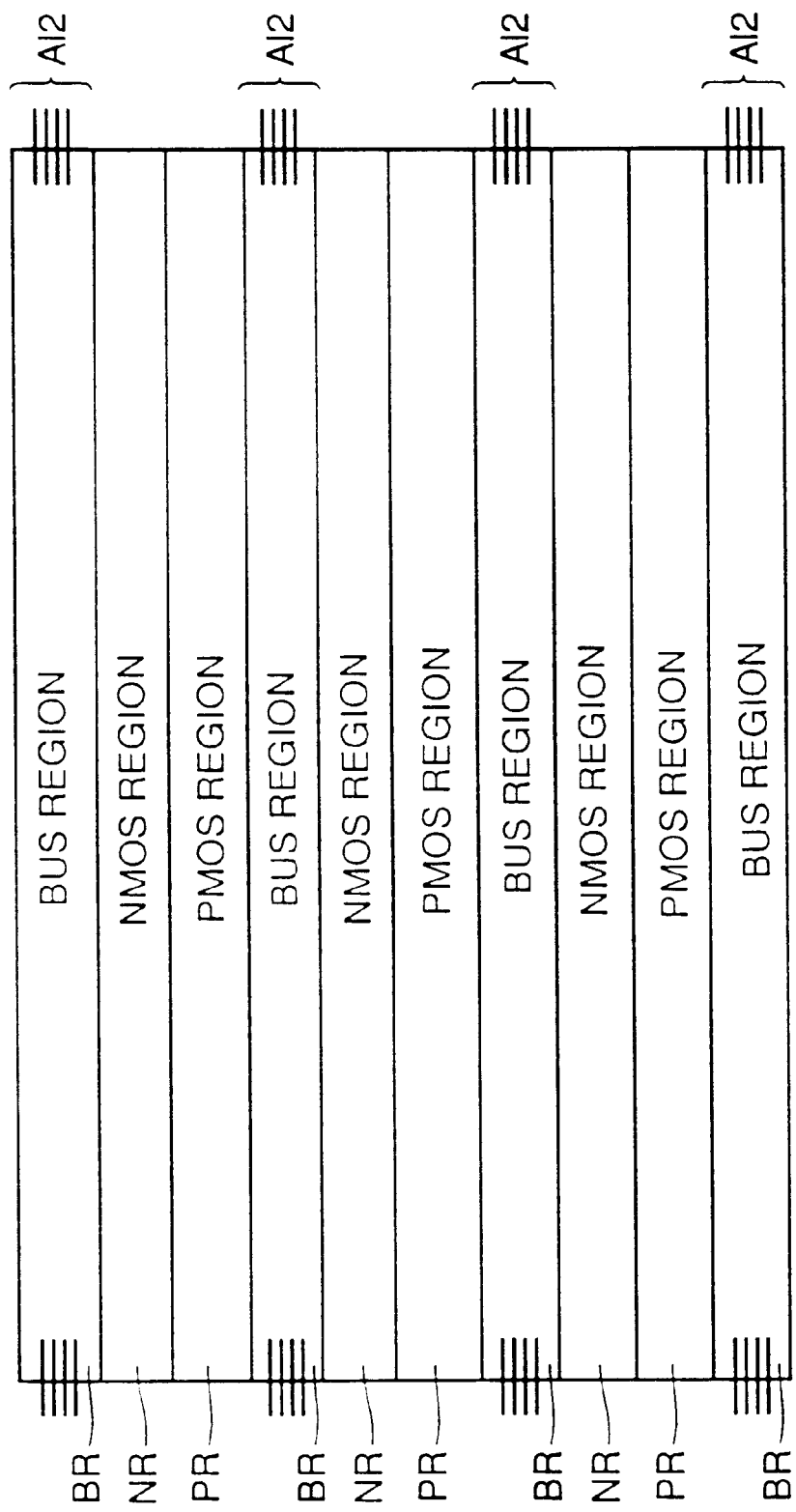
FIG. 15 is an enlarged view of respective regions on a semiconductor substrate in an area X shown in FIG. 13.

Referring again to FIG. 2, NMOS and PMOS regions which are provided with NMOS and PMOS transistors etc. respectively are alternately arranged on the semiconductor substrate in the area X of the peripheral circuit region. The NMOS and PMOS regions are arranged along a direction which is at 90° with respect to that in the conventional DRAM shown in FIG. 15. Further, the bus regions which have been provided on the conventional semiconductor substrate are omitted through first to third wiring layers described later. In addition, hierarchical power supply switching circuit regions SWR forming hierarchical power supply switching circuits including the switching transistors Q1 and Q2 shown in FIG. 11 are provided on respective circuit regions in central portions of the PMOS and NMOS regions.

Semiconductor devices which are formed on the PMOS and NMOS regions are connected with each other through a first high melting point metal wiring layer W (not shown). The high melting point metal wiring layer W and the semiconductor devices are connected with each other through contact holes.

A second aluminum wiring layer Al1 is stacked on the high melting point metal wiring layer W along the vertical direction, i.e., along the shorter edges of the area X. The aluminum wiring layer Al1 is employed as local bus wires LB and hierarchical power supply wires $V_{CC}$, $V_{CC}'$, $V_{SS}$ and $V_{SS}'$ as described later. This aluminum wiring layer Al1 is connected with the semiconductor devices provided on the PMOS and NMOS regions and the high melting point metal wiring layer W through the contact holes and through holes.

A third aluminum wiring layer Al2 is stacked on the second aluminum wiring layer Al1. The aluminum wiring layer Al2, which extends along the longitudinal direction of the area X, is employed as main bus wires MB and power supply wires $V_{CC}$ and $V_{SS}$.

Figure 3:
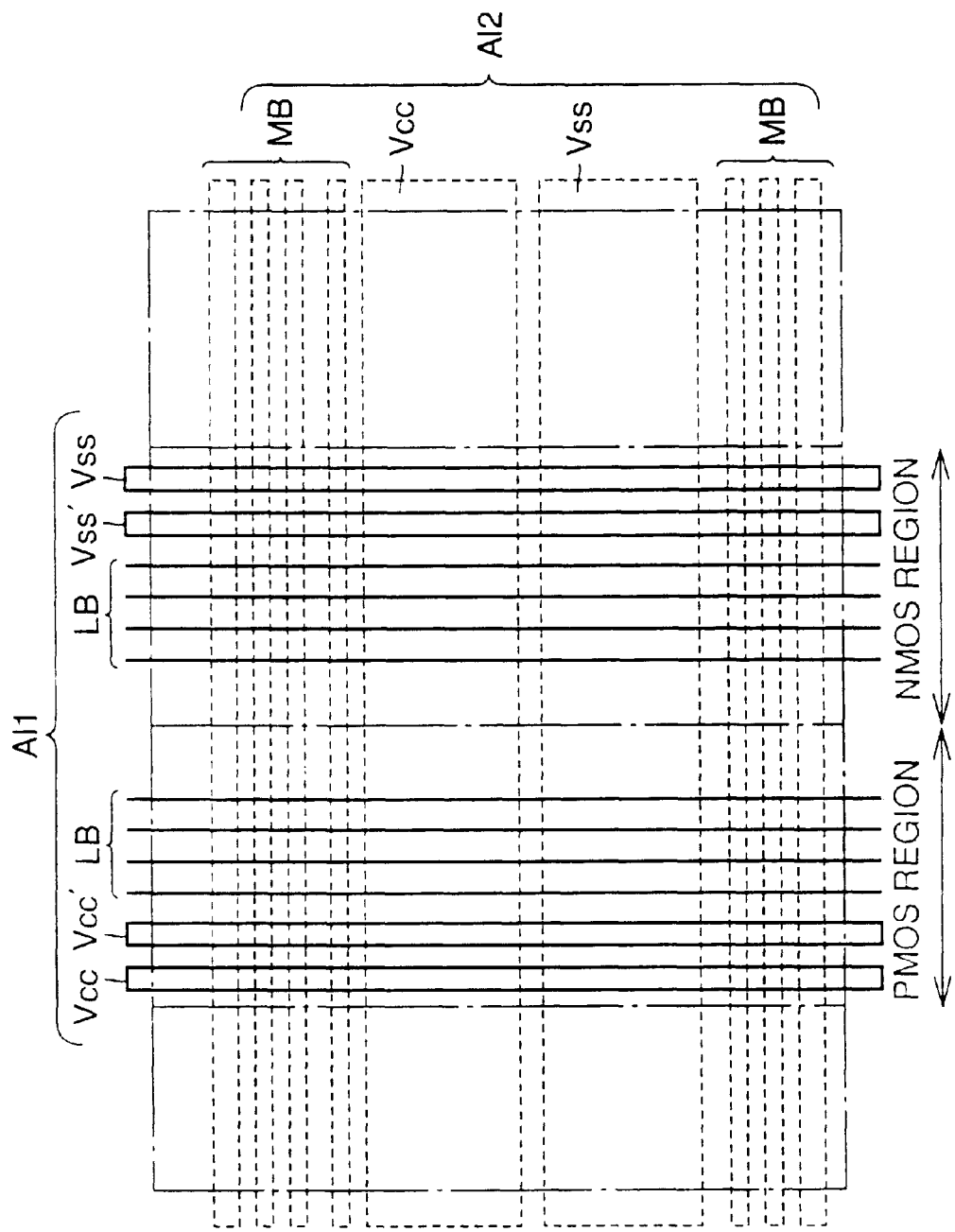
FIG. 3 is an enlarged view of the second and third aluminum wiring layers and the respective regions on the semiconductor substrate shown in FIG. 2.

The aforementioned area X is now described in further detail. FIG. 3 is an enlarged view showing the second and third aluminum wiring layers Al1 and Al2 and respective regions on the semiconductor substrate shown in FIG. 2.

Referring to FIG. 3, the hierarchical power supply wires $V_{CC}$ and $V_{CC}'$ and a plurality of local bus wires LB which are formed by the second aluminum wiring layer Al1 vertically extend on each PMOS region. A plurality of local bus wires LB and the hierarchical power supply wires $V_{SS}$ and $V_{SS}'$ which are formed by the second aluminum wiring layer Al1 also vertically extend on each NMOS region. On the other hand, a plurality of main bus wires MB and the power supply wires $V_{CC}$ and $V_{CC}'$ which are formed by the third aluminum wiring layer Al2 transversely extend across the PMOS and NMOS regions.

Figure 1:
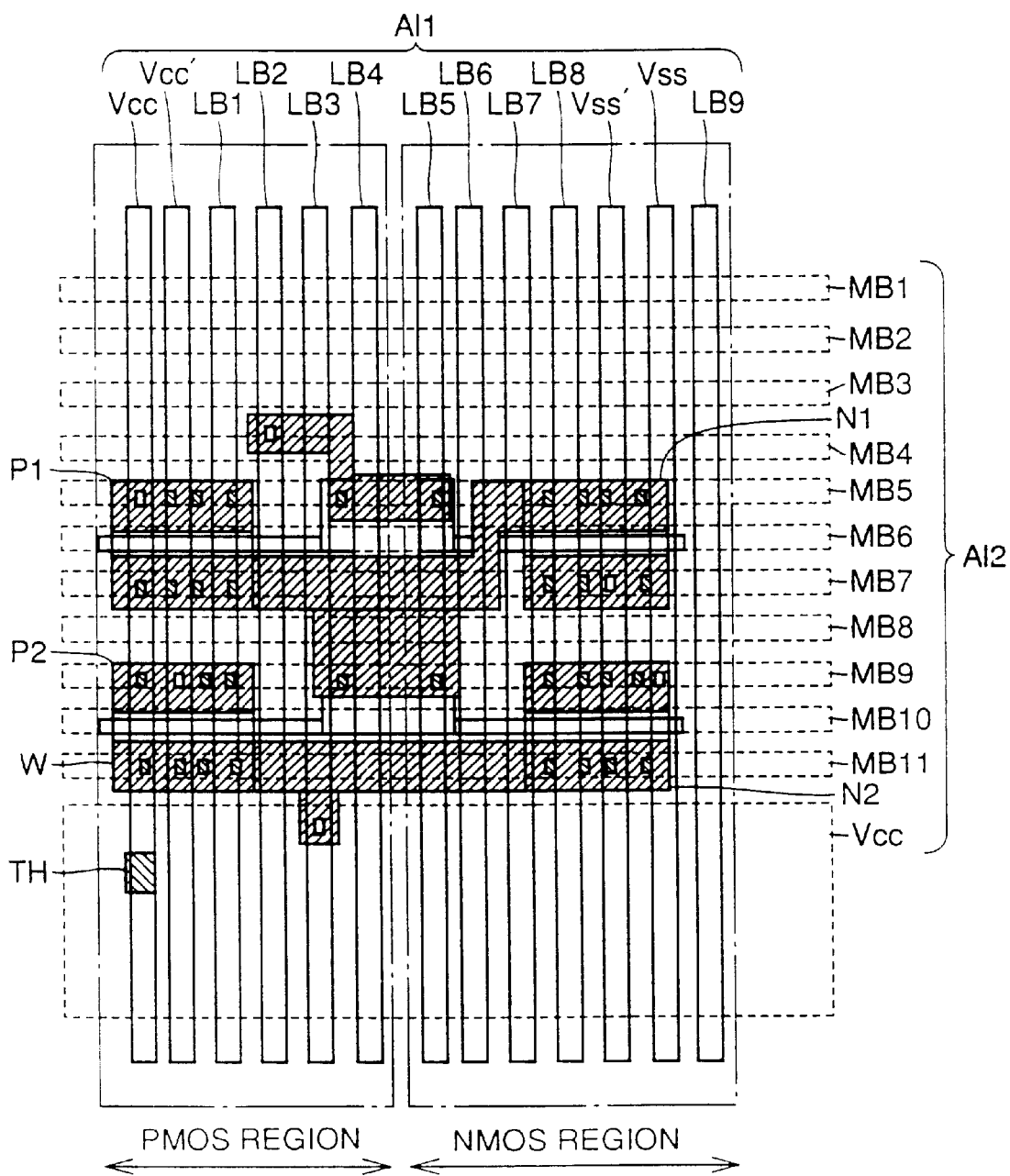
FIG. 1 is an enlarged view of an area Y shown in FIG. 2.

An area Y shown in FIG. 2 is now described in further detail. FIG. 1 is an enlarged view of the area Y shown in FIG. 2.

Referring to FIG. 1, PMOS transistors P1 and P2 are formed on each PMOS region, while NMOS transistors N1 and N2 are formed on each NMOS region. Local wiring layers are formed on the respective transistors P1, P2, N1 and N2 by the high melting point metal wiring layer W (portions shown by slant lines in FIG. 1; this also applies to the remaining figures). The local wiring layers are connected with the respective transistors P1, P2, N1 and N2 through contact holes (small rectangles shown by slant lines in FIG. 1; this also applies to the remaining figures).

The second aluminum wiring layer Al1 is stacked on the high melting point metal wiring layer W. The hierarchical power supply wires $V_{CC}$ and $V_{CC}'$ and local bus wires LB1 to LB4 which are formed by the second aluminum wiring layer Al1 vertically extend on the PMOS region. On the other hand, local bus wires LB5 to LB9 and the hierarchical power supply wires $V_{SS}'$ and $V_{SS}$ which are formed by the second aluminum wiring layer Al1 also vertically extend on the NMOS region. The second aluminum wiring layer Al1 is connected with the transistors P1, P2, N1 and N2 or the high melting point metal wiring layer W via the through holes or the contact holes (small blank squares in FIG. 1; this also applies to the remaining figures).

The third aluminum wiring layer Al2 is stacked on the second aluminum wiring layer Al1. Main bus wires MB1 to MB11 and the power supply wire $V_{CC}$ which are formed by the third aluminum wiring layer Al2 transversely extend across the PMOS and NMOS regions. The second and third aluminum wiring layers Al1 and Al2 are connected with each other via through holes at intersections therebetween, such that the hierarchical power supply wires $V_{CC}$ of the second and third wiring layers Al1 and Al2 are connected with each other via a through hole TH, for example. Due to the aforementioned structure, the inverters I1 and I2 and the hierarchical power supply wires $V_{CC}$, $V_{CC}'$, $V_{SS}'$ and $V_{SS}$ shown in FIG. 11 are formed in the area Y shown in FIG. 2.

As hereinabove described, the second and third aluminum wiring layers Al1 and Al2 can be used as the power supply wires (hierarchical power supply wires) and signal wires (the main bus wires and the local bus wires), whereby it is not necessary to provide bus regions to be provided thereon with only signal wires, i.e., regions provided with no semiconductor devices, on the semiconductor substrate, dissimilarly to the prior art. Thus, all regions can be used as PMOS and NMOS regions, thereby implementing high integration of the semiconductor integrated circuit.

Further, the second and third aluminum wiring layers Al1 and Al2 are arranged to intersect with each other, whereby each signal wire and each power supply wire necessarily intersect with each other in a single portion. Thus, it is possible to arbitrarily connect the second and third aluminum wiring layers Al1 and Al2 with each other by connecting such intersections, thereby remarkably simplifying the layout on the semiconductor substrate.

According to this embodiment, the second aluminum wiring layer Al1 is held between the high melting point metal wiring layer W and the third aluminum wiring layer Al2, whereby the wiring capacitance of the second aluminum wiring layer Al1 is increased while that of the third aluminum wiring layer Al2 is reduced. Therefore, it is possible to form the long main bus wires MB1 to MB11 by the third aluminum wiring layer Al2 having a small wiring capacitance for transmitting signals through the main bus wires MB1 to MB11 at a high speed, thereby improving high-speed response of the device.

Figure 16:
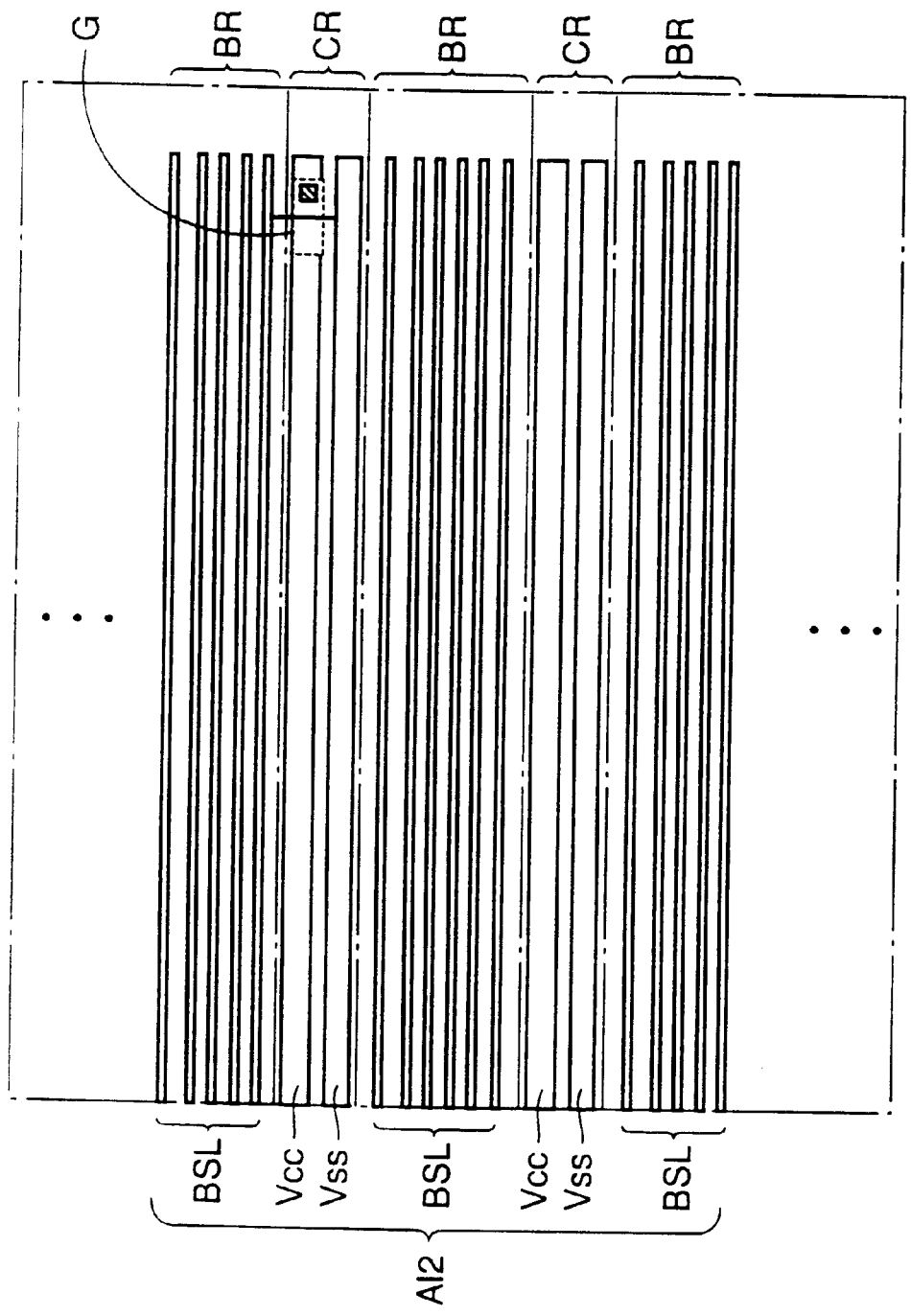
FIG. 16 is an enlarged view showing the structure of a third aluminum wiring layer in the area X shown in FIG. 13.

Further, the second and third aluminum wiring layers Al1 and Al2 may be provided with only single ones of respective signal wires and power supply wires, whereby the layout area is reduced as compared with the conventional circuit shown in FIG. 16 provided with plural power supply wires along the same direction, and it is possible to reduce impedances of the power supply wires. In addition, the main bus wires MB can be laid out regardless of the arrangement of the transistors P1, P2, N1 and N2, whereby the layout area can further be reduced.

Figure 4:
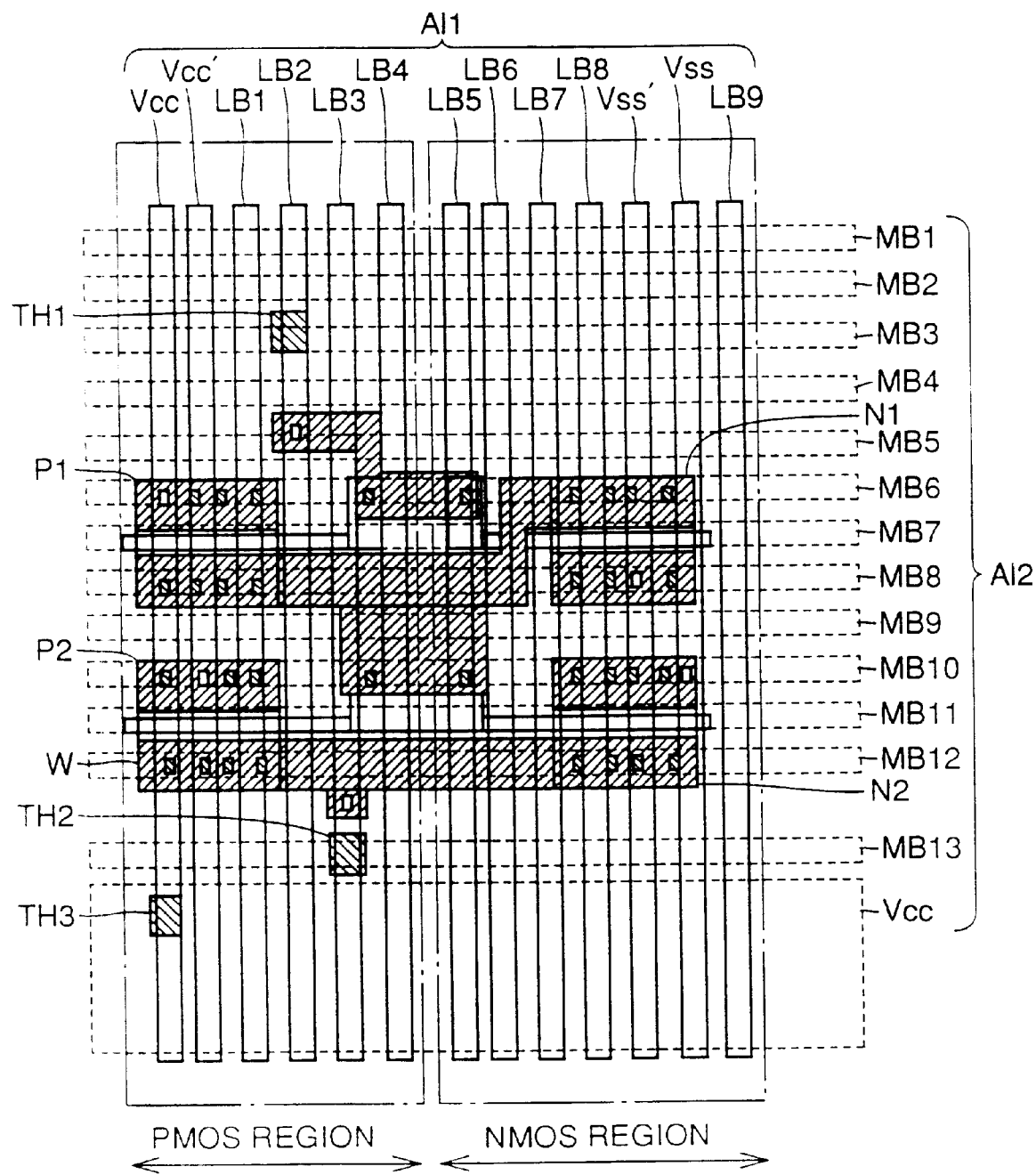
FIG. 4 illustrates concrete examples of an input and an output through main bus wires on the area Y shown in FIG. 3.

A concrete operation for inputting and outputting signals in and from arbitrary main bus wires through the semiconductor integrated circuit shown in FIG. 1 is now described. FIG. 4 illustrates concrete examples of an input and an output through arbitrary main bus wires on the area Y shown in FIG. 1.

Referring to FIG. 4, the local bus wire LB2 which is formed by the second aluminum wiring layer Al1 and the main bus wire MB3 which is formed by the third aluminum wiring layer Al2 are connected with each other by a through hole TH1. Further, the local bus wire LB3 and the main bus wire MB13 are connected with each other by a through hole TH2. Consequently, it is possible to input an input signal A shown in FIG. 11 from the main bus wire MB3, and to output an output signal B from the main bus wire MB13. Thus, it is possible to input and output signals in and from arbitrary main bus wires respectively by connecting the same with arbitrary local bus wires, whereby local and main buses can be extremely easily wired.

Figure 5:
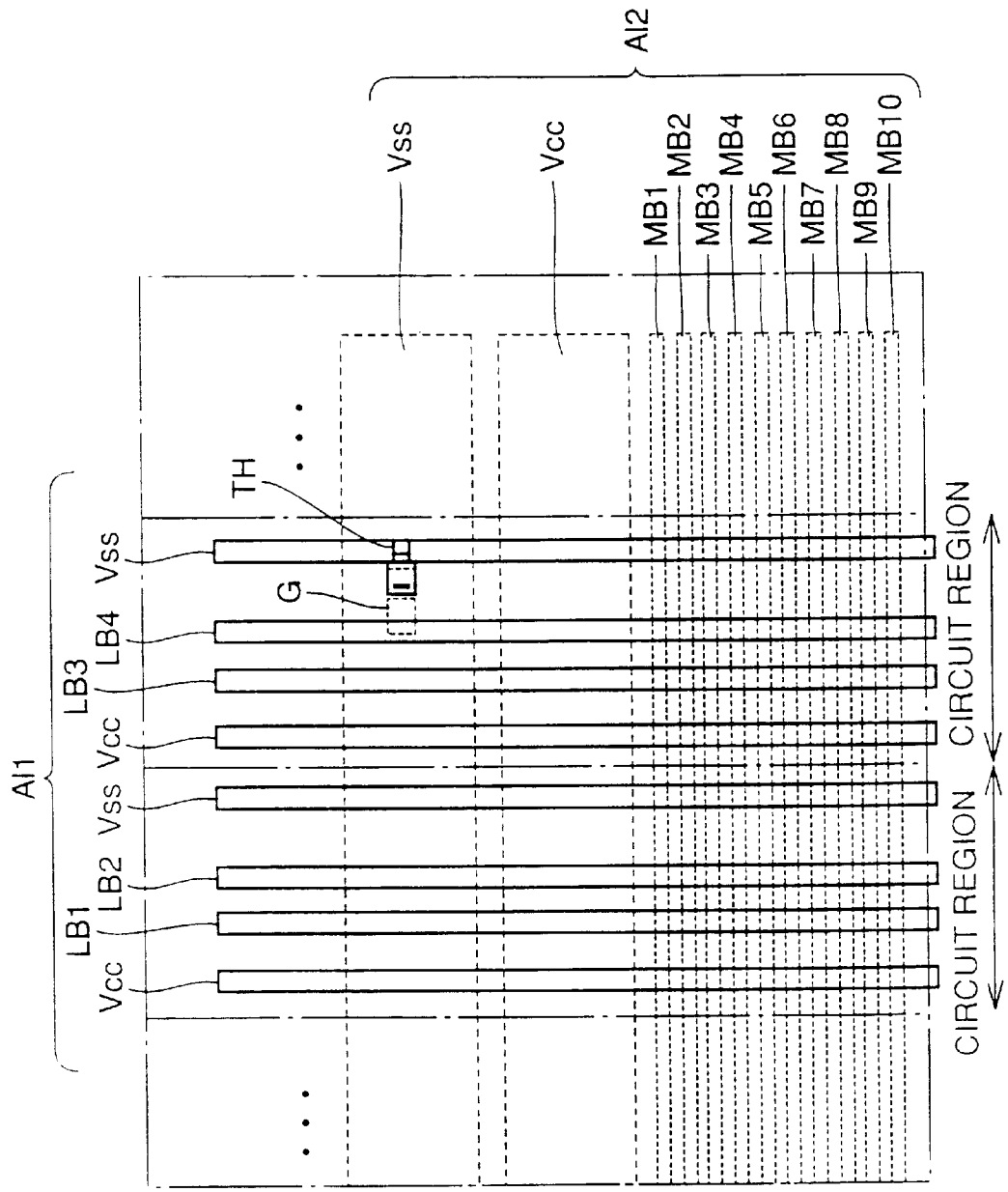
FIG. 5 illustrates second and third aluminum wiring layers in an area X of a peripheral circuit region and respective regions on a semiconductor substrate in a semiconductor integrated circuit according to a second embodiment of the present invention.

A semiconductor integrated circuit according to a second embodiment of the present invention is now described with reference to the drawings. FIG. 5 illustrates second and third aluminum wiring layers in an area X of a peripheral circuit region and respective regions on a semiconductor substrate in the semiconductor integrated circuit according to the second embodiment of the present invention.

Referring to FIG. 5, the semiconductor substrate is divided into a plurality of circuit regions including PMOS and NMOS regions. Local wiring layers are formed by a high melting point metal wiring layer W (not shown) on the respective circuit regions, and a second aluminum wiring layer Al1 is stacked thereon. Power supply wires $V_{CC}$ and $V_{SS}$ and a plurality of local bus wires LB1, LB2, LB3 and LB4 which are formed by the second aluminum wiring layer Al1 vertically extend on the respective circuit regions.

A third aluminum wiring layer Al2 is stacked on the second aluminum wiring layer Al1. Power supply wires $V_{SS}$ and $V_{CC}$ and main bus wires MB1 to MB10 which are formed by the third aluminum wiring layer Al2 transversely extend across the plurality of circuit regions. As hereinabove described, the second embodiment shown in FIG. 5 employs not the hierarchical power supply structure, but an ordinary power supply structure.

Figure 6:
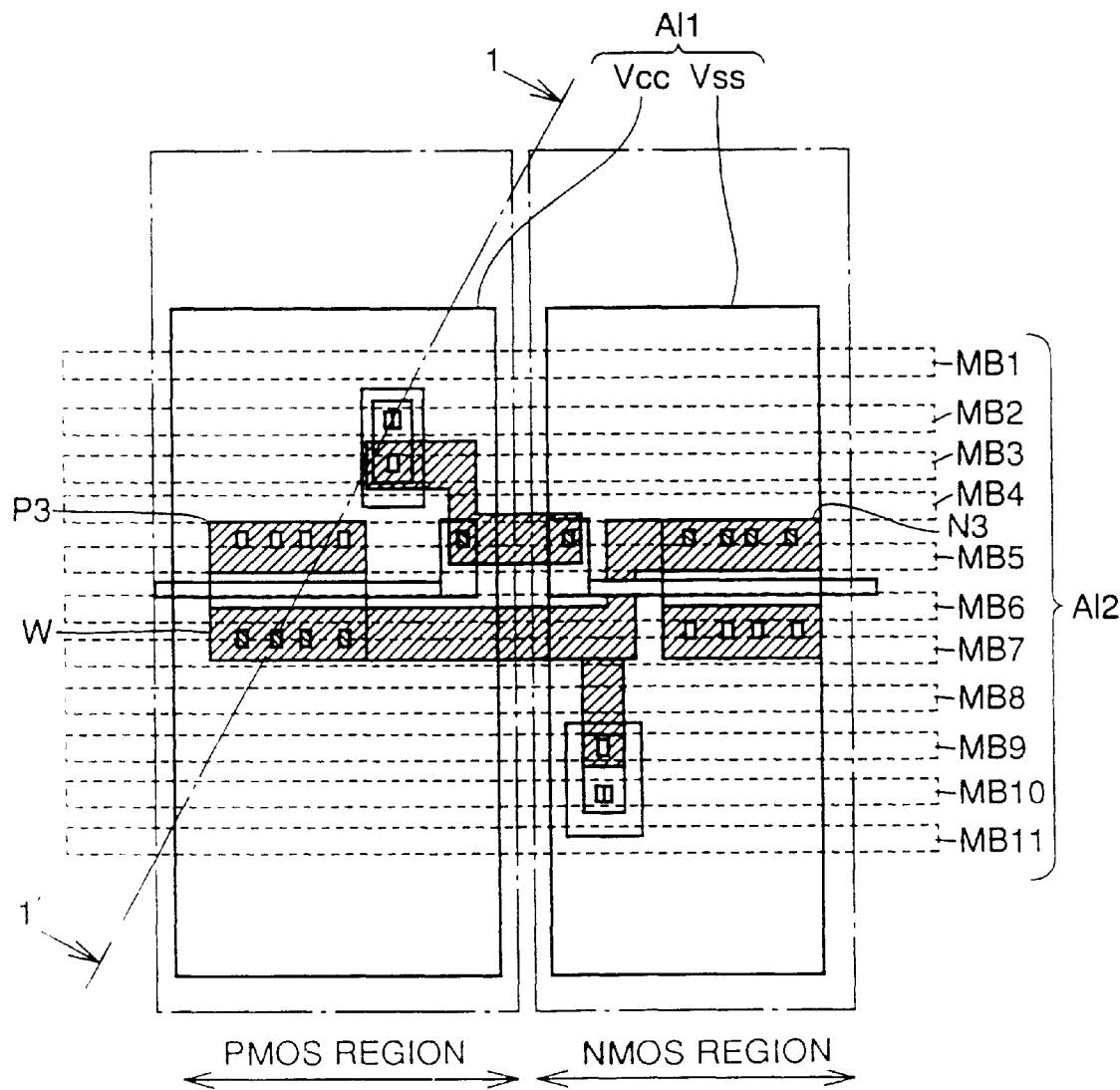
FIG. 6 is an enlarged view of the respective wiring layers and the respective regions on the semiconductor substrate shown in FIG. 5.
Figure 12:
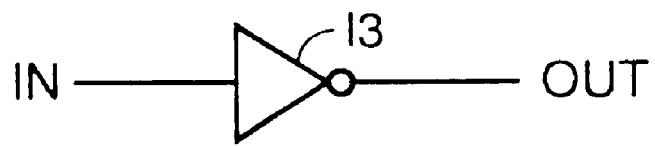
FIG. 12 is a symbol diagram showing an inverter.

The second and third aluminum wiring layers Al1 and Al2 and the respective regions provided on the semiconductor substrate shown in FIG. 5 are now described in further detail. FIG. 6 is an enlarged view of the wiring layers Al1 and Al2 and the respective regions provided on the semiconductor substrate shown in FIG. 5. Referring to FIG. 6, an inverter I3 shown in FIG. 12 is structured.

Referring to FIG. 6, PMOS and NMOS transistors P3 and N3 are formed on PMOS and NMOS regions respectively. These transistors P3 and N3 are connected with the first high melting point metal wiring layer W through contact holes, so that the high melting point metal wiring layer W is employed as local wires for the transistors P3 and N3.

The second aluminum wiring layer Al1 is stacked on the first high melting point metal wiring layer W. The power supply wire $V_{CC}$ is vertically formed by the second aluminum wiring layer Al1 on the overall upper surface of the PMOS region. The power supply wire $V_{SS}$ is similarly formed on the NMOS region. The power supply wires $V_{CC}$ and $V_{SS}$ are partially hollowed to be employed as connecting portions for connecting the third aluminum wiring layer Al2 with the first high melting point wiring layer W via through holes, as described later.

The third aluminum wiring layer Al2 is stacked on the second aluminum wiring layer Al1. Main bus wires MB1 to MB11 which are formed by the third aluminum wiring layer Al2 transversely extend across the PMOS and NMOS regions. The first high melting point metal wiring layer W and the second and third aluminum wiring layers Al1 and Al2 are connected similarly to those in the first embodiment respectively.

According to this embodiment, the main bus wires MB2 and MB10 are employed as input and output wires of the inverter I3. Since the main bus wires MB2 and MB10 are in proximity to the transistors P3 and N3, the power supply wires $V_{CC}$ and $V_{SS}$ of the second aluminum wiring layer Al1 are partially hollowed so that the hollowed portions serve as connecting portions between the main bus wires MB2 and MB10 and the high melting point wiring layer W. Therefore, the local bus wires employed in the first embodiment are not necessary. Consequently, the wiring lengths from the transistors P3 and N3 are reduced, whereby the signal transmission speed is increased. Further, it is possible to widen the power supply wires $V_{CC}$ and $V_{SS}$ for substantially covering the main bus wires MB1 to MB11. Thus, the reinforced power supply wires $V_{CC}$ and $V_{SS}$ are arranged between the first high melting point metal wiring layer W and the third aluminum wiring layer Al2 to serve as shielding wires, whereby crosstalks between the first high melting point metal wiring layer W and the third aluminum wiring layer Al2 are reduced to reduce coupling noises of the signal wires.

Figure 7:
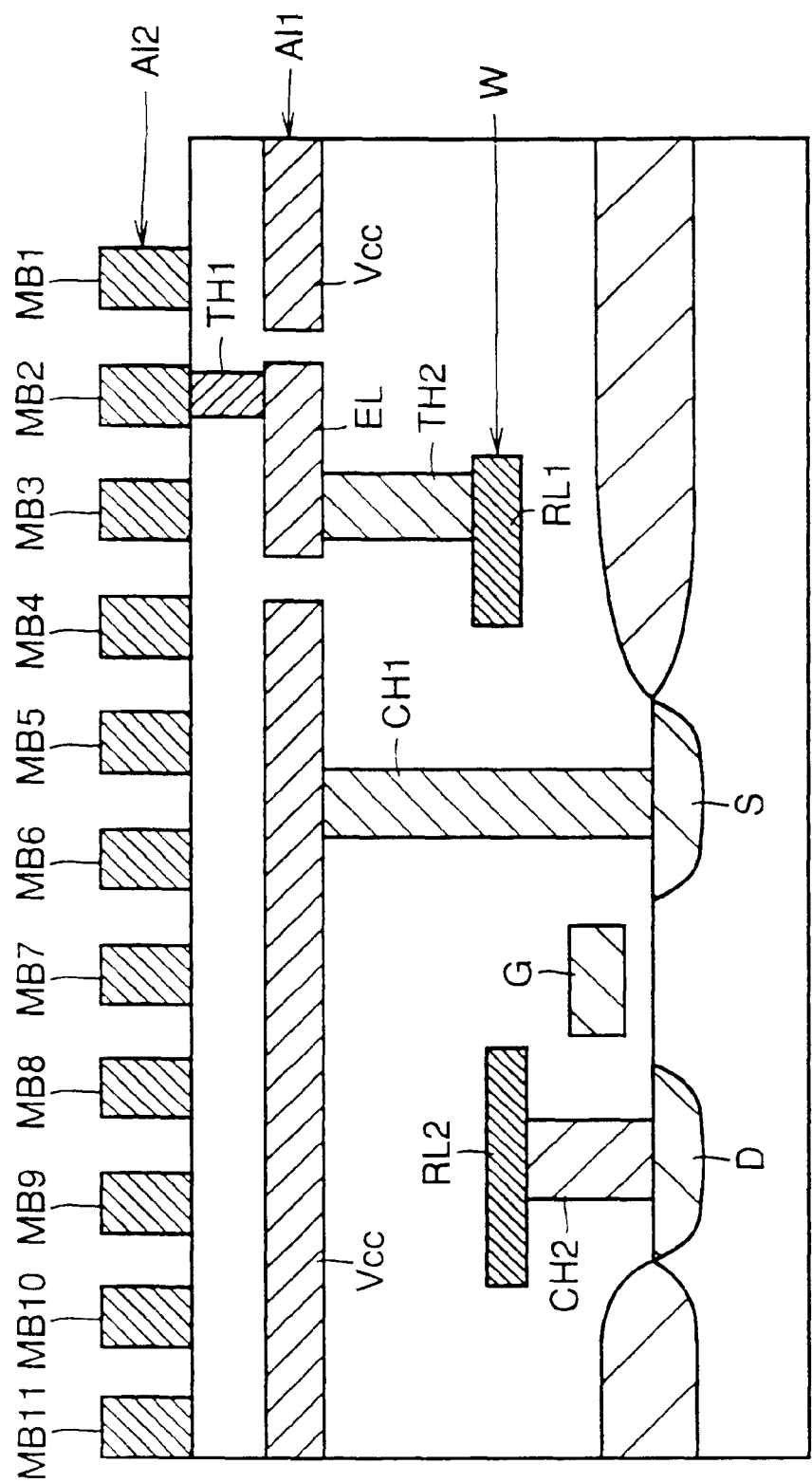
FIG. 7 is a sectional view taken along the line 1–1' in FIG. 6.

The sectional structure of the second embodiment is now described in detail. FIG. 7 is a sectional view taken along the line 1–1' in FIG. 6.

Referring to FIG. 7, a source S of the PMOS transistor P3 is connected with the power supply wire $V_{CC}$ of the second aluminum wiring layer Al1 through a contact hole CH1, for example. On the other hand, its drain is connected with a local wire RL2 which is formed by the high melting point metal wiring layer W through a contact hole CH2. A local wire RL1 which is formed by the high melting point metal wiring layer W is connected with a connecting portion EL which is formed by hollowing the power supply wire $V_{CC}$, via a through hole TH2. This connecting portion EL is connected with the main bus wire MB2 via a through hole TH1. The NMOS transistor N3 is also connected in a similar manner. As hereinabove described, the respective wires are easy to lay out similarly to the first embodiment, also when the second aluminum wiring layer Al1 is employed as the power supply wires, due to the connecting portions formed by partially hollowing the same.

While the second embodiment has been described with reference to an ordinary power supply structure, it is also possible to attain a similar effect by employing a hierarchical power supply structure, similarly to the first embodiment. Further, it is also possible to reduce electric resistances of the power supply wires by increasing the widths thereof as compared with the PMOS and NMOS regions.

Figure 8:
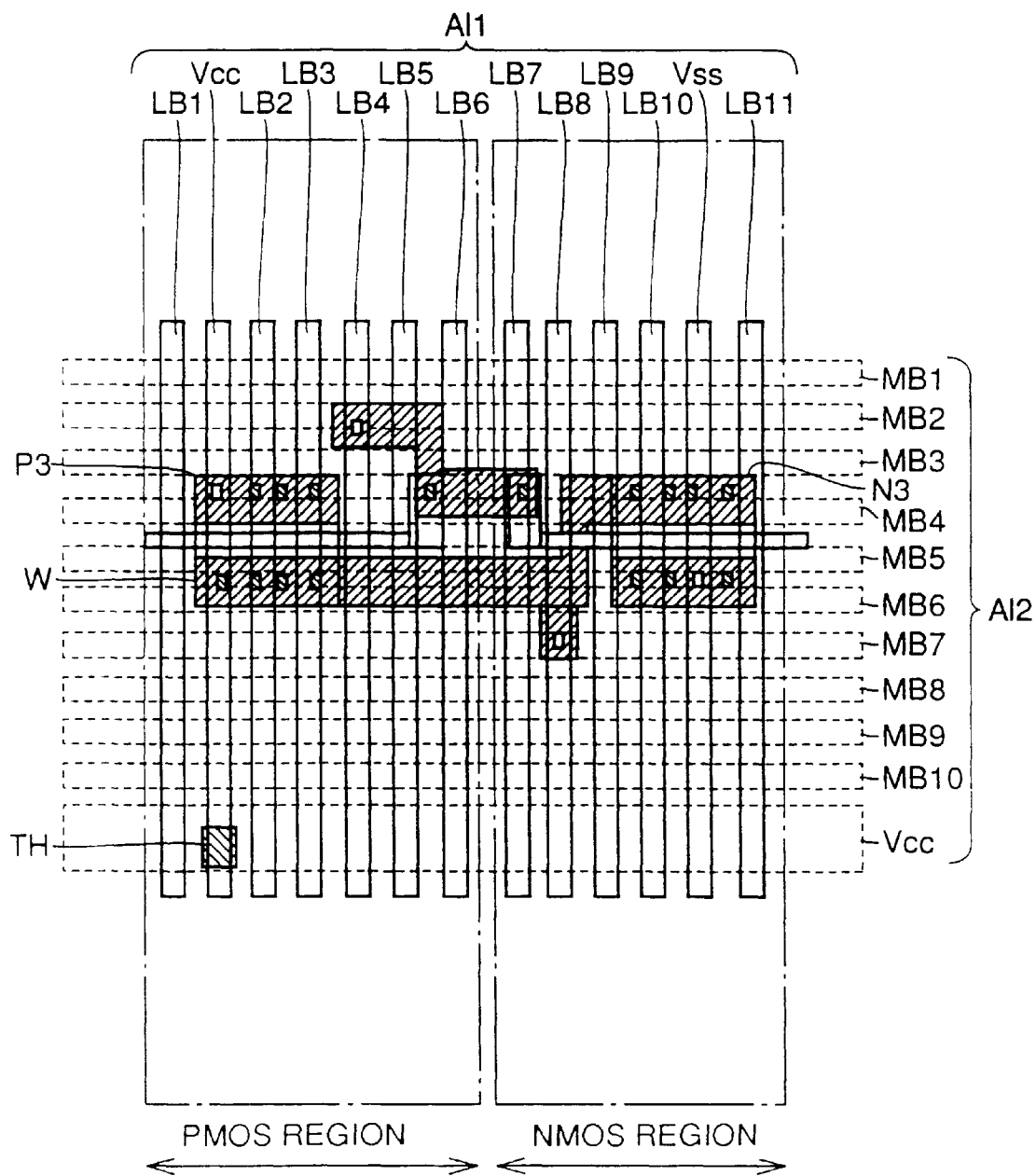
FIG. 8 is an enlarged view showing respective aluminum wiring layers in an area X of a peripheral circuit region and respective regions on a semiconductor substrate in a semiconductor integrated circuit according to a third embodiment of the present invention.

A semiconductor integrated circuit according to a third embodiment of the present invention is now described with reference to the drawing. FIG. 8 is an enlarged view showing respective wiring layers in an area X of a peripheral circuit region and respective regions on a semiconductor substrate in the semiconductor integrated circuit according to the third embodiment of the present invention. In the third embodiment, the inverter shown in the second embodiment is structured by local bus wires LB1 to LB11 and power supply wires $V_{CC}$ and $V_{SS}$ which are formed by a second aluminum wiring layer Al1. Also according to the third embodiment, the local bus wires LB1 to LB11 and the power supply wires $V_{CC}$ and $V_{SS}$ vertically extend while main bus wires MB1 to MB10 and a power supply wire $V_{CC}$ which are formed by a third aluminum wiring layer Al2 transversely extend to intersect with each other on PMOS and NMOS regions, whereby an effect similar to that of the first embodiment can be attained.

Figure 9:
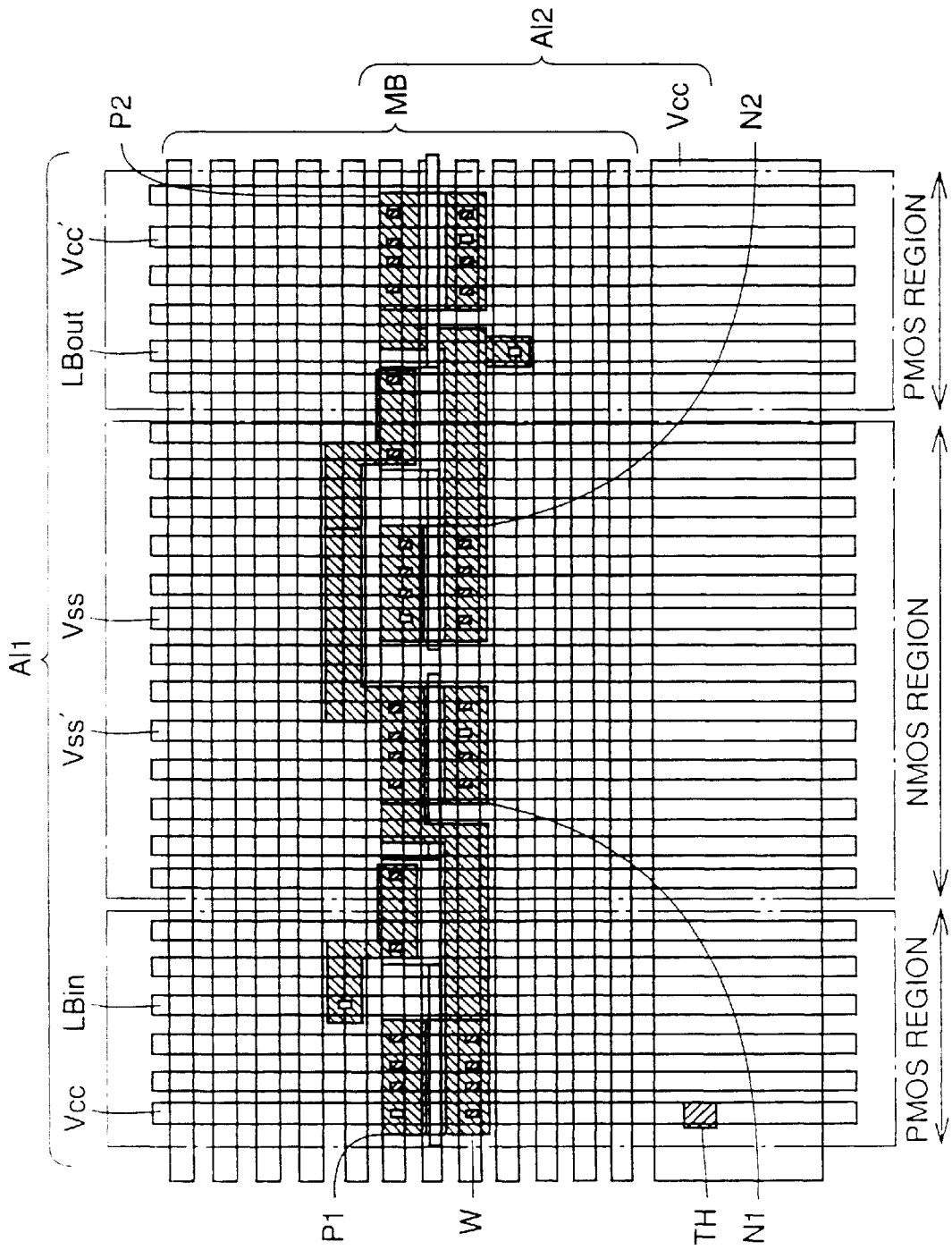
FIG. 9 is an enlarged view showing respective aluminum wiring layers in an area X of a peripheral circuit region and respective regions on a semiconductor substrate in a semiconductor integrated circuit according to a fourth embodiment of the present invention.

A semiconductor integrated circuit according to a fourth embodiment of the present invention is now described with reference to the drawing. FIG. 9 is an enlarged view showing respective wiring layers in an area X of a peripheral circuit region and respective regions on a semiconductor substrate in the semiconductor integrated circuit according to the fourth embodiment of the present invention.

In the semiconductor integrated circuit shown in FIG. 9, the inverter train of the hierarchical power supply structure shown in FIG. 11 is laid out through two sets of circuit regions. Referring to FIG. 9, the upper surface of a semiconductor substrate is divided into PMOS, NMOS, NMOS and PMOS regions in this order, so that a PMOS transistor P1, an NMOS transistor N1, an NMOS transistor N2 and a PMOS transistor P2 are formed thereon respectively in this order from the left side toward the right side of FIG. 9. The transistors P1, P2, N1 and N2, a first high melting point metal wiring layer W, a second aluminum wiring layer Al1 and a third aluminum wiring layer Al2 are connected similarly to those in the semiconductor integrated circuit shown in FIG. 3 respectively, and hence redundant description is omitted. In the inverter train shown in FIG. 9, the input signal A for the inverter I1 is inputted from a local bus wire LBin which is formed by the second aluminum wiring layer Al1, while the output signal B of the inverter I2 is outputted from a local bus wire LBout. The local bus wires LBin and LBout intersect with main bus wires MB, and it is possible to input/output signals in/from the inverter train through arbitrary ones of the main bus wires MB by connecting the local bus wires LBin and LBout with these main bus wires MB, for attaining an effect similar to that of the first embodiment.

Since two NMOS regions are arranged between the PMOS regions, the space between the PMOS regions is so widened that it is possible to prevent the circuit from being latched up. This also applies to a case of reversely arranging these regions.

According to this embodiment, each of the PMOS and NMOS regions may be supplied with only one of prescribed hierarchical power supply voltages. Namely, two circuit regions may be supplied with only one set of hierarchical power supply voltages, whereby the number of the hierarchical power supply wires is so reduced that the circuit is suitable for high integration, and the local bus wires are easy to lay out.

Figure 10:
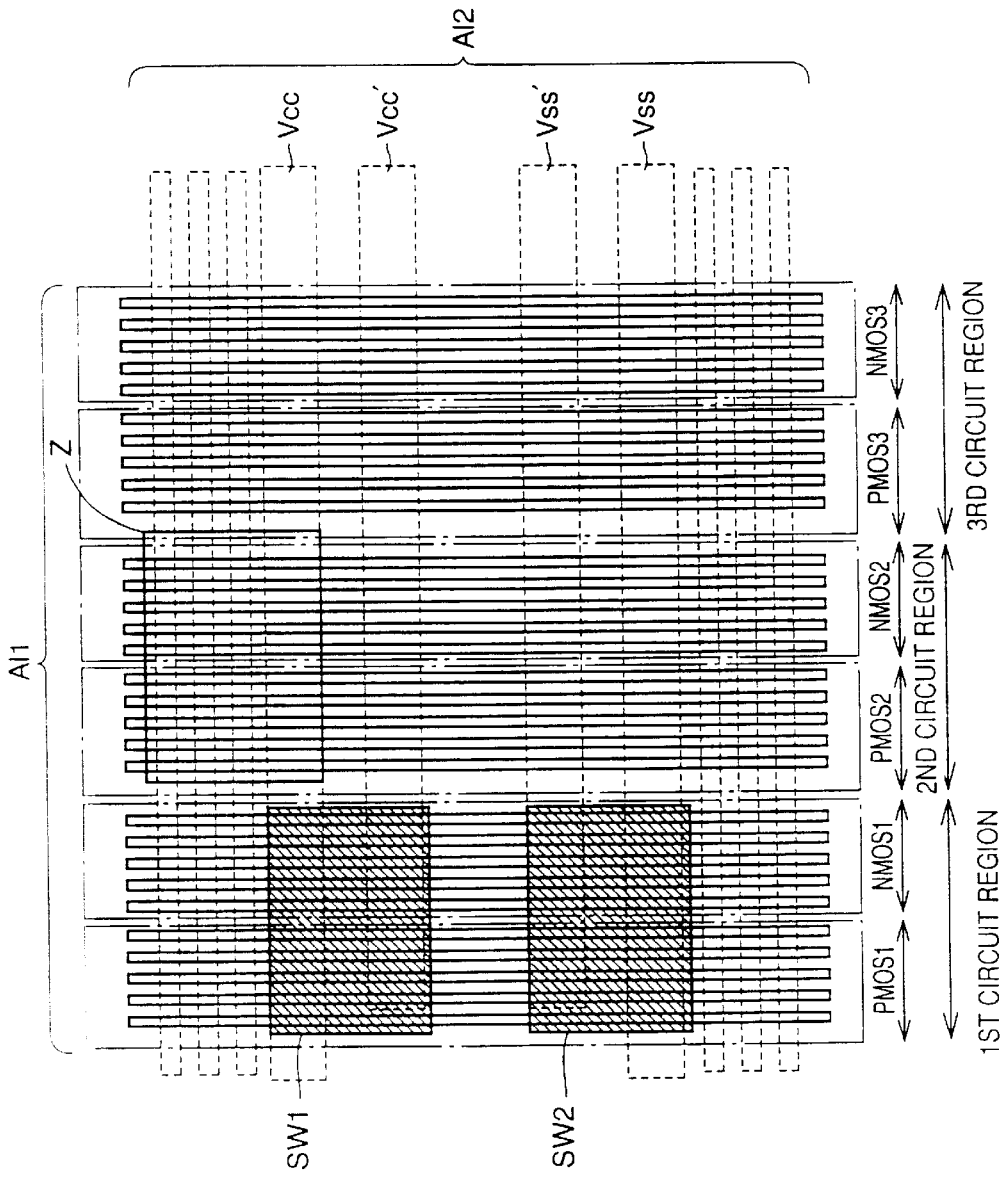
FIG. 10 is an enlarged view showing respective aluminum wiring layers in an area X of a peripheral circuit region and respective regions on a semiconductor substrate in a semiconductor integrated circuit according to a fifth embodiment of the present invention.

A semiconductor integrated circuit according to a fifth embodiment of the present invention is now described with reference to the drawing. FIG. 10 is an enlarged view showing respective wiring layers in an area X of a peripheral circuit region and respective regions on a semiconductor substrate in the semiconductor integrated circuit according to the fifth embodiment of the present invention.

While the first embodiment requires a set of switching regions for a hierarchical power supply structure with respect to a set of circuit regions, the fifth embodiment employs a set of switching regions for a hierarchical power supply structure with respect to a plurality of circuit regions.

Referring to FIG. 10, a first circuit region which is formed by a PMOS region PMOS1 and an NMOS region NMOS1 is set on the semiconductor substrate, while second and third circuit regions are also set on the semiconductor substrate in a similar manner. An area Z corresponds to the portion shown in FIG. 1. Switching regions SW1 and SW2 of a hierarchical power supply structure are provided in the first circuit region, while no switching regions are provided in the second and third circuit regions. On the switching regions SW1 and SW2, hierarchical power supply wires $V_{CC}$, $V_{CC}'$, $V_{SS}'$ and $V_{SS}$ which are formed by a third aluminum wiring layer Al2 transversely extend across the first to third circuit regions. Therefore, hierarchical power supply voltages generated in the switching regions SW1 and SW2 are supplied to the second and third circuit regions by the hierarchical power supply wires $V_{CC}$, $V_{CC}'$, $V_{SS}'$ and $V_{SS}$. Consequently, it is possible to supply the hierarchical power supply voltages to the plurality of circuit regions through only one set of switching regions of the hierarchical power supply structure, thereby reducing the areas of the switching regions and enabling high integration. Further, the layout of the respective wiring layers is simplified by such reduction of the areas.

In each of the aforementioned embodiments, it is possible to remarkably reduce the layout area for the peripheral circuits by laying out the same through the high melting point metal wiring layer, which has been generally employed only for bit lines, and the two aluminum wiring layers. Further, it is also possible to reduce impedances of the power supply wires, thereby reducing capacitances of and noises between the signal wires. In addition, it is possible to readily arrange prescribed transistors with respect to the main bus wires with no limitation, whereby flexibility for the layout is extremely improved to simplify computer aided design of the layout. Consequently, the time required for the layout is remarkably reduced. Further, it is possible to implement speed increase of the semiconductor integrated circuit, reduction in power consumption, enlargement of operating margins and high integration.

While each of the above embodiments has been described with reference to a DRAM, the present invention is also applicable to other types of semiconductor integrated circuits so far as the same can utilize triple wiring layers. In the DRAM, on the other hand, it is possible to utilize the high melting point metal wiring layer which has been generally employed for forming bit lines as such, to attain a similar effect with no increase of the fabrication steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending along the first direction and on the first and second regions respectively, and formed by a second metal wiring layer stacked on the first metal wiring layer with an insulation layer laid therebetween; and a plurality of upper wires disposed extending along the second direction and formed by a third metal wiring layer stacked on the second metal wiring layer.

2. The semiconductor device according to claim 1, wherein said first metal wiring layer is a high melting point metal wiring layer, and said second and third metal wiring layers are aluminum wiring layers.

3. The semiconductor device according to claim 1, wherein the predetermined area includes shorter sides extending along the first direction and longer sides, longer than the shorter sides, extending along the second direction.

4. The semiconductor device according to claim 1, wherein said first wire is connected to a gate of the first transistor.

5. The semiconductor device according to claim 1, further comprising:

a signal bus wire disposed extending along the first direction, formed by the second metal wiring layer, and connected to said local wire.

6. The semiconductor device according to claim 1, wherein said local wire has a portion extending from the first region to the second region along the second direction.

7. The semiconductor device according to claim 4, wherein said first wire is connected to one of said plurality of upper wires via a through hole.

8. The semiconductor device according to claim 5, wherein said signal bus wire is connected to one of said plurality of upper wires via a through hole.

9. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending along the first direction and on the first and second regions respectively, and formed by a second metal wiring layer stacked on the first metal wiring layer; and a plurality of upper wires disposed extending along the second direction and formed by a third metal wiring layer stacked on the second metal wiring layer; wherein said first wire is a first power supply wire, said second wire is a second power supply wire, a source of the first transistor is coupled to said first power supply wire, and said semiconductor device further comprises:

a third power supply wire, and a first switching transistor coupled between said first power supply wire and said third power supply wire.

10. The semiconductor device according to claim 9, further comprising:

a fourth power supply wire; and a second switching transistor coupled between said second power supply wire and said fourth power supply wire, wherein a source of the second transistor is coupled to said second power supply wire, and the predetermined area further includes a third transistor of the first conductivity type having a source coupled to said third power supply wire and a gate connected to said local wire, and a fourth transistor of the second conductivity type having a source coupled to said fourth power supply wire and a gate connected to said local wire.

11. The semiconductor device according to claim 9, wherein said first switching transistor is formed on a third region included in the predetermined area, the first, second and third regions are arranged along the second direction, said plurality of upper wires include fourth and fifth power supply wires connected to a source and a drain of said first switching transistor respectively, said first and third power supply wires are connected to said fourth and fifth power supply wires via through holes respectively, and said first switching transistor is coupled between said first and third power supply wires via said fourth and fifth power supply wires.

12. The semiconductor device according to claim 10, wherein said third and fourth power supply wires are disposed extending along the first direction and formed by the second metal wiring layer.

13. The semiconductor device according to claim 10, wherein the third and fourth transistors are formed on the first and second regions respectively.

14. The semiconductor device according to claim 10, wherein the third and fourth transistors are formed on third and fourth regions included in the predetermined area respectively, and the first, second, third and fourth regions are arranged along the second direction.

15. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending alone the first direction and on the first and second regions respectively, and formed by a second metal wiring layer stacked on the first metal wiring layer; and a plurality of upper wires disposed extending along the second direction and formed by a third metal wiring layer stacked on the second metal wiring layer; wherein said first wire is a first power supply wire coupled to a source of the first transistor, and said plurality of upper wires include a second power supply wire connected to said first power supply wire via a through hole.

16. The semiconductor device according to claim 15, wherein said second power supply wire has a width larger than a width of said first power supply wire.

17. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending along the first direction and on the first and second regions respectively, and formed by a second metal wiring layer stacked on the first metal wiring layer; and a plurality of upper wires disposed extending along the second direction and formed by a third metal wiring layer stacked on the second metal wiring layer; wherein said first wire is a first power supply wire coupled to a source of the first transistor, covering the first transistor and having a window for connection of said local wire with one of said plurality of upper wires, and said semiconductor device further comprises:

a connecting portion formed by the second metal wiring layer in the window, and connected to said local wire and one of said plurality of upper wires.

18. The semiconductor device according to claim 17, wherein said second wire is a second power supply wire coupled to a source of the second transistor, covering the second transistor and having a window, and said semiconductor device further comprises another connecting portion formed by the second metal wiring layer in the window of said second wire, and connected to the other of said plurality of upper wires and another local wire which is formed by the first metal wiring layer and is connected to a gate of the second transistor.

19. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending along the first direction and on the first and second regions respectively, and formed by a second metal wiring layer stacked on the first metal wiring layer; and a plurality of upper wires disposed extending along the second direction and formed by a third metal wiring layer stacked on the second metal wiring layer; wherein said first wire is a first power supply wire coupled to a source of the first transistor, covering the first transistor and having a window, and said semiconductor device further comprises:

a connecting portion formed by the second metal wiring layer in the window, and connected to one of said plurality of upper wires and another local wire which is formed by the first metal wiring layer and connected to a gate of the first transistor.

20. The semiconductor device according to claim 19, wherein the other local wire is connected to a gate of the second transistor.

21. A semiconductor device comprising:

first and second memory cell array regions arranged along a first direction;

a peripheral circuit region including a predetermined area provided between said first and second memory cell array regions, the predetermined area including a first transistor of a first conductivity type formed on a first region and a second transistor of a second conductivity type formed on a second region, the first and second regions being arranged along a second direction crossing the first direction;

a local wire connected to drains of the first and second transistors and formed by a first metal wiring layer;

first and second wires disposed extending along the first direction and on the first and second regions respectively, and formed by a second metal wiring layer stacked on the first metal wiring layer with an insulation layer laid therebetween; and a plurality of upper wires disposed extending along the second direction and formed by a third metal wiring layer stacked on the second metal wiring layer; wherein each of said first and second memory cell array regions includes a plurality of dynamic memory cells and a plurality of bit lines formed by the first metal wiring layer.

22. A semiconductor device comprising:

first and second memory cell array regions arranged along a first direction;

a peripheral circuit region including a predetermined area provided between said first and second memory cell array regions, the predetermined area having shorter sides extending along the first direction and longer sides, longer than the shorter sides, extending along a second direction crossing the first direction;

a first wire disposed on the predetermined area and formed by a first aluminum wiring layer laid on the high melting point metal wiring layer with an insulation layer laid therebetween; and a third wire disposed on the predetermined area and formed by a second aluminum wiring layer above the first aluminum wiring layer.

* * * * *